United States Patent
Douglas et al.

(10) Patent No.: US 9,530,820 B1
(45) Date of Patent: Dec. 27, 2016

(54) METHOD OF ISOLATING BAD PIXELS ON A WAFER

(71) Applicant: Teledyne Scientific & Imaging, LLC, Thousand Oaks, CA (US)

(72) Inventors: Sheri Douglas, Newbury Park, CA (US); Chi Yi Chen, Westlake Village, CA (US); Jon Ellsworth, Newbury Park, CA (US); Aristo Yulius, Simi Valley, CA (US); Gerrit Meddeler, Los Angeles, CA (US)

(73) Assignee: TELEDYNE SCIENTIFIC & IMAGING, LLC, Thousand Oaks, CA (US)

( * ) Notice: Subject to any disclaimer, the term of this patent is extended or adjusted under 35 U.S.C. 154(b) by 0 days.

(21) Appl. No.: 15/047,409

(22) Filed: Feb. 18, 2016

(51) Int. Cl.
*H01L 21/00* (2006.01)
*H01L 27/146* (2006.01)

(52) U.S. Cl.
CPC ..... *H01L 27/14698* (2013.01); *H01L 27/1463* (2013.01); *H01L 27/14687* (2013.01); *H01L 27/14696* (2013.01)

(58) Field of Classification Search
CPC .... H04N 5/2254; H04N 5/2257; H04N 5/213; H04N 5/357; G09G 2330/08; G09G 2300/043; G09G 2320/0285; G09G 2330/10; H01L 33/62; H01L 33/36; H01L 33/48; H01L 2224/18; H01L 51/5203; H01L 27/1288; H01L 27/14636; H01L 27/14634; H01L 27/1469; H01L 27/146; H01L 27/14643; H01L 27/14698; H01L 27/1463; H01L 27/14696; H01L 27/14687; H01L 21/441; H01L 2933/0066
See application file for complete search history.

(56) References Cited

U.S. PATENT DOCUMENTS

| | | | | |
|---|---|---|---|---|
| 5,721,472 | A * | 2/1998 | Browning | G09G 3/006 315/169.1 |
| 5,723,866 | A * | 3/1998 | Hamilton, Jr. | H01L 27/1465 250/370.01 |
| 2002/0101558 | A1 * | 8/2002 | Nemeth | G02F 1/1309 349/192 |
| 2008/0210872 | A1 * | 9/2008 | Grimberg | G01J 5/522 250/339.04 |

\* cited by examiner

*Primary Examiner* — Julio J Maldonado
*Assistant Examiner* — Cory Eskridge
(74) *Attorney, Agent, or Firm* — Snell & Wilmer LLP

(57) ABSTRACT

A method of isolating bad pixels on a wafer comprising the steps of determining physical locations of the bad pixels on the wafer, creating a mask based on the physical locations of the bad pixels, imprinting the mask onto the wafer, and hybridizing the wafer onto a readout integrated circuit (ROIC).

20 Claims, 5 Drawing Sheets

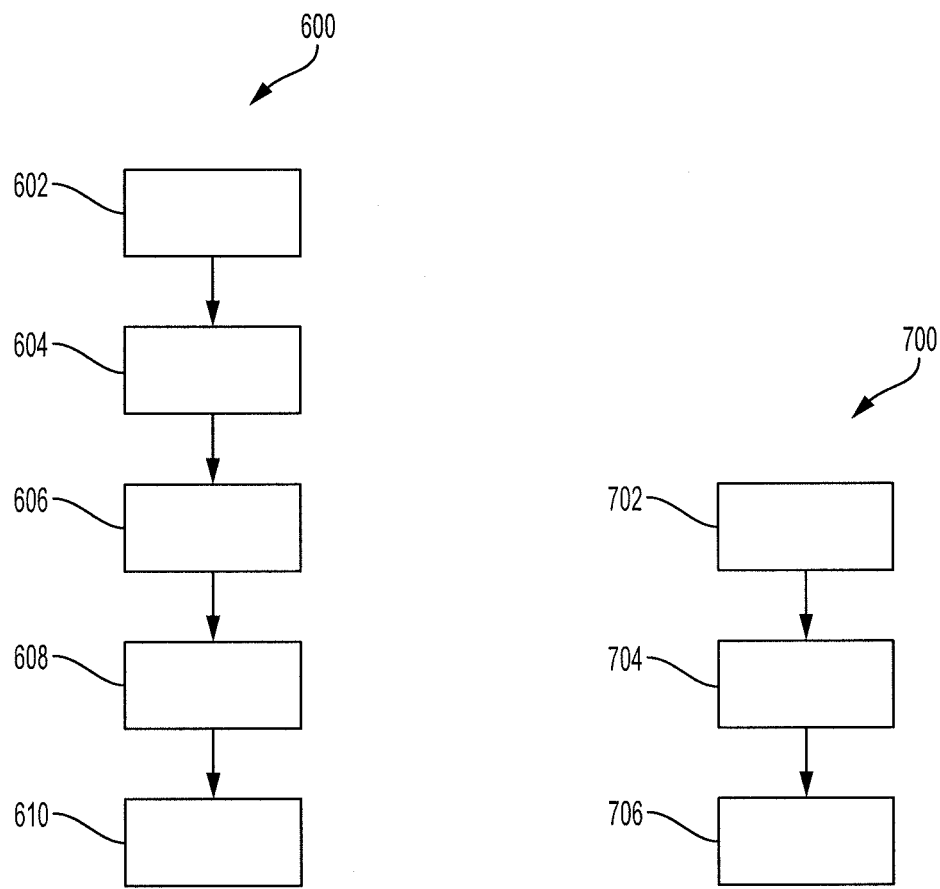

METHOD OF ISOLATING BAD PIXELS ON A WAFER

BACKGROUND

1. Field of the Invention

The present invention relates generally to sensor chip assemblies (SCAs), and more particularly to methods of isolating bad pixels caused by growth defects in Mercury Cadmium Telluride (HgCdTe, also known as MCT) SCAs.

2. Description of the Related Art

Readout integrated circuits (ROICs) are used in combination with detectors for a variety of applications, including infrared and ultraviolet detection. For given ROIC architectures, a defect in a single detector pixel can cause and entire SCA column to fail. Current methods operate to fix the problems associated with bad pixels by using post-manufacturing software programs associated with correction algorithms. However, such methods do not address the root cause of the problem, which are the bad pixels themselves generating faulty signals from an SCA to a hybridized ROIC.

Accordingly, there is a need for a method of mapping and isolating bad pixels that overcomes the drawbacks and shortcomings stated above.

SUMMARY OF THE INVENTION

The present invention aims to address the above-cited limitations in current state-of-the-art SCAs by providing the ability to map and isolate bad pixels prior to hybridizing a detector chip (i.e., a wafer comprising a plurality of pixels) to an ROIC. Locations of the bad pixels are determined on the wafer, and a mask is created based on the locations such that the bad pixels do not communicate faulty signals to the ROIC after hybridization. The mask prevents the bad pixels from hybridizing with the ROIC, while still allowing signals from good pixels through.

The contents of this summary section are provided only as a simplified introduction to the invention, and are not intended to be used to limit the scope of the appended claims. The present disclosure has been described above in terms of presently preferred embodiments so that an understanding of the present disclosure can be conveyed. However, there are other embodiments not specifically described herein for which the present disclosure is applicable. Therefore, the present disclosure should not be seen as limited to the forms shown, which should be considered illustrative rather than restrictive.

An exemplary embodiment of the present invention's method of isolating bad pixels on a wafer comprises the steps of determining physical locations of the bad pixels on the wafer, creating a mask based on the physical locations of the bad pixels, imprinting the mask onto the wafer, and hybridizing the wafer onto an ROIC.

In related versions, the wafer comprises a plurality of pixels, each pixel corresponding to a closed via on the mask.

In related versions, the step of creating the mask further comprises opening all of the closed vias except for those corresponding to the bad pixels.

In related versions, each bad pixel corresponds to a closed via such that the bad pixels are prevented from communicating signals to the ROIC.

In related versions, the method further comprises, after the step of determining physical locations, the steps of assigning each of the physical locations of the bad pixels to an X-Y coordinate value, and plotting the X-Y coordinate values onto an X-Y coordinate plane.

In related versions, the mask is created based on the physical locations of the bad pixels as plotted onto the X-Y coordinate plane.

In related versions, the wafer comprises an SCA.

An exemplary embodiment of the present invention's method for isolating bad pixels on a wafer comprises the steps of establishing alignment targets on the wafer, determining physical locations of the bad pixels relative to the alignment targets, translating the physical locations onto a mask, and imprinting the mask onto the wafer.

In related versions, the method further comprises the step of hybridizing the wafer onto an ROIC such that the mask prevents electrical coupling between the bad pixels and the ROIC.

In related versions, each of the physical locations corresponds to an X-Y coordinate for translation onto the mask.

In related versions, the wafer comprises a plurality of pixels, each pixel corresponding to a closed via on the mask.

In related versions, the step of imprinting the mask further comprises opening all of the closed vias except for those corresponding to the bad pixels.

In related versions, each bad pixel corresponds to a closed via such that the bad pixels are prevented from communicating signals to the ROIC.

In related versions, the mask comprises a metal insulating layer.

An exemplary embodiment of the present invention's method for isolating bad pixels on a wafer comprises a plurality of pixels, comprising the steps of determining physical locations of good pixels on the wafer, opening a plurality of closed vias on the wafer corresponding to the physical locations of the good pixels, and hybridizing the wafer onto an ROIC comprising a plurality of indium bumps, each of the plurality of indium bumps corresponding to each of the plurality of pixels.

In related versions, each bad pixel corresponds to a closed via such that the bad pixels are prevented from communicating signals to the ROIC.

In related versions, the method further comprises, after the step of determining physical locations, the steps of assigning each of the physical locations of the good pixels to an X-Y coordinate value, and plotting the X-Y coordinate values onto an X-Y coordinate plane.

In related versions, the method further comprises creating a mask based on the physical locations of the good pixels as plotted onto the X-Y coordinate plane.

In related versions, the mask determines which of the plurality of closed vias is to be opened.

In related versions, the wafer comprises an SCA.

BRIEF DESCRIPTION OF THE DRAWINGS

Other systems, methods, features and advantages of the present invention will be or will become apparent to one of ordinary skill in the art upon examination of the following figures and detailed descriptions. It is intended that all such additional apparatuses, systems, methods, features and advantages be included within this description, be within the scope of the present invention, and be protected by the appended claims. Component parts shown in the drawings are not necessarily to scale, and may be exaggerated to better illustrate the important features of the present invention. In the drawings, like reference numerals designate like parts throughout the different views, wherein:

FIG. 6 is a flowchart depicting a method for isolating bad pixels according to an exemplary embodiment of the present invention.

FIG. 7 is a flowchart depicting a method for isolating bad pixels according to an exemplary embodiment of the present invention.

DETAILED DESCRIPTION

The present invention's method represents a novel way of preventing bad pixels from communicating erroneous signals in a sensor chip assembly (SCA). The present invention's method achieves this outcome by identifying locations of bad pixels on the wafer, and creates a mask based on the locations of the bad pixels that is used to prevent coupling of the bad pixels to a readout integrated circuit (ROIC). Specifically, the present invention's method identifies which vias on the mask to open in order to allow only good pixels to communicate signals to the ROIC after hybridizing.

Figure 1:
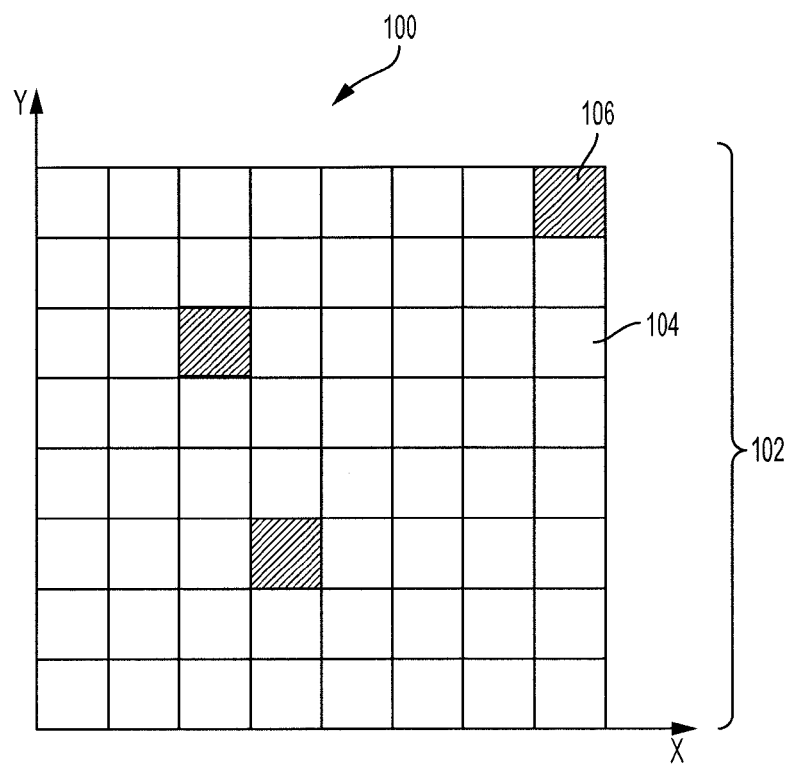
FIG. 1 is a diagram depicting a wafer for isolating bad pixels according to an exemplary embodiment of the present invention.

FIG. 1 is a diagram depicting a wafer 100 according to an exemplary embodiment of the present invention's method for isolating bad pixels. Wafer 100 can be a detector chip well-known in the art for detecting and translating light signals into electric signals. Wafer 100 can comprise a plurality of pixels 102, each pixel configured to detect and translate light signals into electric signals. In some versions, wafer 100 can be a Mercury Cadmium Telluride (HgCdTe, also known as MCT) SCA.

The plurality of pixels 102 can comprise good pixels 104 and bad pixels 106. The bad pixels 106 can be pixels that are damaged, defective, or otherwise faulty. The good pixels 104 are represented by unshaded regions on wafer 100, and the bad pixels 106 are represented by shaded regions on wafer 100. In any given wafer, a plurality of good pixels 104 and bad pixels 106 can be present. The bad pixels 106 can be detected using methods well known in the art for detecting bad pixels. The remaining pixels which are not identified as bad pixels can be determined to be good pixels.

Positions of the pixels 102 can be determined by plotting their relation to each other on an X-Y coordinate plane, as illustrated in FIG. 1. For example, the locations of the bad pixels 106 can be represented as (3, 6), (4, 3), and (8, 8). The locations of the good pixels 104 can be similarly represented by X-Y coordinates. In some versions, alignments can be used to aid in the plotting of the X-Y coordinates for the pixels. Additionally, correctional algorithms can be used to further pinpoint the exact locations of the good and bad pixels on the wafer.

Figure 2:
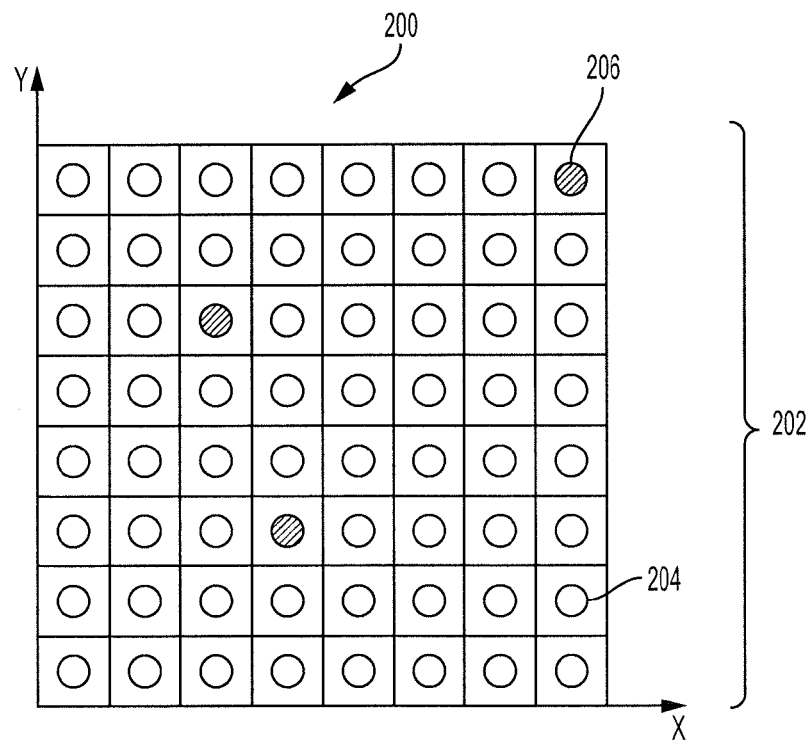
FIG. 2 is a diagram depicting a mask for isolating bad pixels according to an exemplary embodiment of the present invention.

FIG. 2 is a diagram depicting a mask 200 according to an exemplary embodiment of the present invention's method for isolating bad pixels. The mask can comprise a plurality of vias 202. As described herein, a "via" refers to an electrical connection resulting from a hole in a circuit board, as commonly known in the art. Each via 202 can be a circle with a radius of 2.5 μm.

The plurality of vias 202 can comprise open vias 204 and closed vias 206. As described herein, a closed via refers to a via that does not create an electrical connection because the hole is not opened. As described herein, an open via refers to a via that creates an electrical connection because the hole is opened.

The vias 202 can be arranged on a grid, as shown in FIG. 2, such that each via 202 corresponds to each pixel 102. As with the pixels 202, the vias 202 can be similarly plotted on an X-Y coordinate plane such that the location of each via can be represented by an X-Y coordinate. In some versions, good pixels 104 correspond to open vias 204, and bad pixels 106 correspond to closed vias 206. For example, the vias 202 on mask 200 can be open or closed depending on whether the corresponding pixel 102 is good or bad. As determined above, the X-Y coordinates of the bad pixels 106 is (3, 6), (4, 3), and (8, 8) on the wafer 100. As a result, the X-Y coordinates of the closed vias 206 is (3, 6), (4, 3), and (8, 8) on the mask 200. Therefore, when the mask 200 is superimposed onto the wafer 100, the open vias 204 correspond to good pixels 104, and the closed vias 206 correspond to bad pixels 106. The open vias 204 enable communication of electrical signals, whereas the closed vias 206 block electrical signals. This results in signals being communicated by only the good pixels 104, because the bad pixels 106 are blocked.

In related versions, the mask 200 can be sized to match the wafer 100 such that each pixel 102 corresponds to each via 202. For example, superimposing the mask 200 over the wafer 100 results in a perfect match of each pixel 102 to each via 202. Alternatively, the mask 200 can be larger or smaller than the wafer 100, such that the pixels 102 do not correspond in number to the vias 202.

In some versions, the mask 200 can comprise a metal sheet or a metal insulating layer. The mask 200 can be a physical mask or a digital mask adapted to be imprinted onto the wafer 100. The plurality of vias 202 can also all be initially closed, such that the vias to be opened are determined by the locations of the good pixels. Alternatively, the vias 202 can all be initially open, and the vias to be closed are determined by the locations of the bad pixels. Opening and closing of the vias can be accomplished according to methods and means well known in the art for computers.

Figure 3:
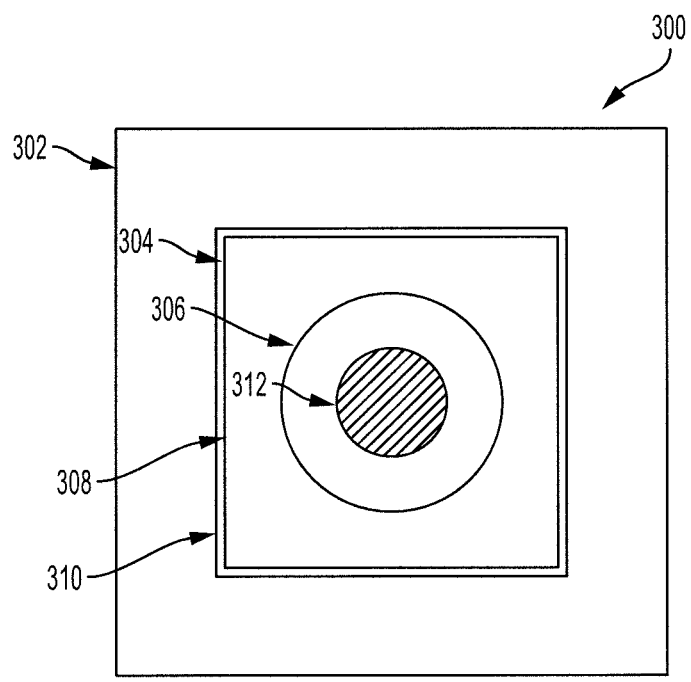
FIG. 3 is a diagram depicting a top view of a pixel for isolating bad pixels according to an exemplary embodiment of the present invention.

FIG. 3 is a diagram depicting a top view of a pixel 300 according to an exemplary embodiment of the present invention's method for isolating bad pixels. The pixel 300 can comprise a pitch 302, an implant 304, a P contact 306, a metal square 308, and an indium square 310. The pixel 300 can be substantially square-shaped. The pitch 302 can also be square-shaped and substantially the same size as the pixel 300. The implant 304 can be square-shaped and occupy an area smaller than the pitch 302 within the pixel 300. The metal square 308 can occupy an area slightly smaller than the implant 304 within the pixel 300. The indium square 310 can be substantially the same size as the implant 304. Finally, the P contact 306 can be a circle occupying an area smaller than the metal square 308 within the pixel 300.

In related versions, the pitch 302, the implant 304, the P contact 306, the metal square 308, and the indium square 310 can be concentrically oriented on the pixel 300. For example, the pitch 302, the implant 304, the P contact 306, the metal square 308, and the indium square 310 can all share a common center.

In related versions, the pitch 302 can have sides that are 12.5 μm, the implant 304 can have sides that are 8 μm, the P contact 306 can have a radius of 5 μm, the metal square 308 can have sides that are 7.5 μm, and the indium square 310 can have sides that are 8 μm.

In related versions, the pixel 300 can further comprise a via 312. The via 312 can be smaller than all of the other elements, and can be an indium bump having a base radius of 2.5 μm. The via 312 can be concentrically oriented with the pitch 302, the implant 304, the P contact 306, the metal square 308, and the indium square 310. Additionally, the via 312 can share a common center with the pitch 302, the implant 304, the P contact 306, the metal square 308, and the indium square 310. The via 312 can be open or closed depending on whether the pixel 300 is a good pixel or a bad pixel. Further description regarding the structure of open and closed vias is discussed below.

Figure 4:
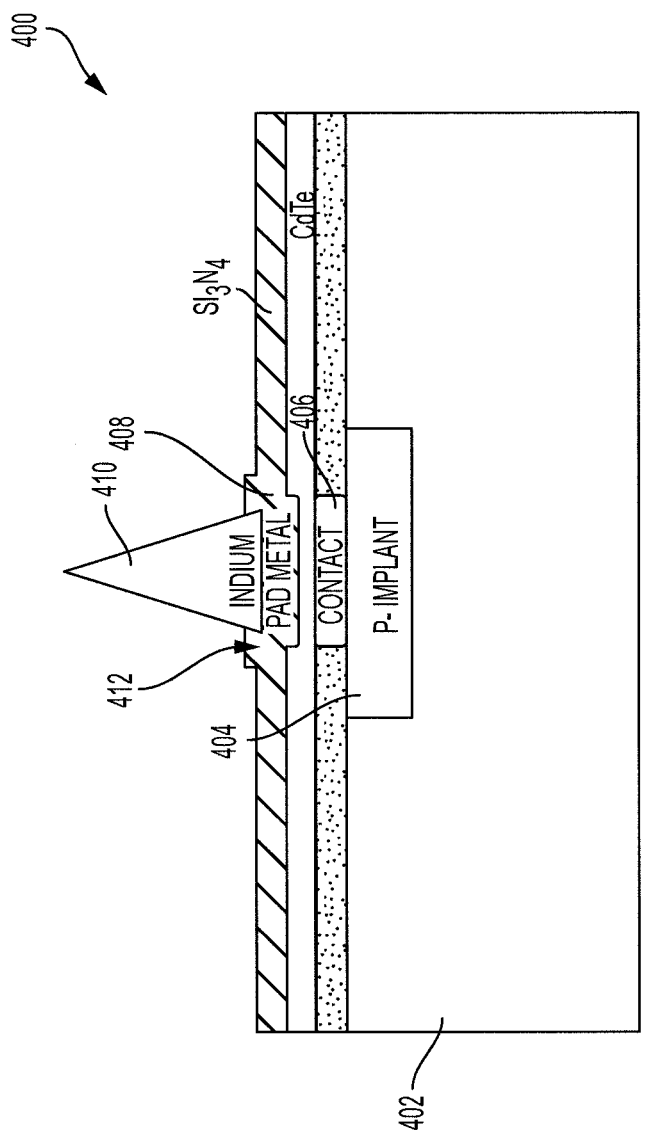
FIG. 4 is a diagram depicting a cross-sectional view of a hybridized ROIC of a good pixel for isolating bad pixels according to an exemplary embodiment of the present invention.

FIG. 4 is a diagram depicting a cross-sectional view of a hybridized ROIC 400 of a good pixel according to an exemplary embodiment of the present invention's method for isolating bad pixels. The hybridized ROIC 400 can comprise a pixel 402, an implant 404, a P contact 406, a pad metal 408, and a via 410. In related versions, the via 410 can be an indium bump as well-known in the art. As illustrated, the implant 404, the P contact 406, the pad metal 408 and the via 410 are arranged epitaxially as known in the art for SCAs. In related versions, the P contact 406 can comprise a CdTe epitaxial layer, and the pad metal 408 can comprise $Si_3N_4$.

In this case, the pixel 402 is a good pixel, and so the via 410 is open. Opening of the via 410 can be accomplished by creating a hole 412 in the pad metal 408 such that the via 410 makes contact with the P contact 406. In certain versions, the pad metal 408 is a part of the mask as described above. The mask can comprise a sheet of pad metal 408 with vias corresponding to each pixel of a wafer. Holes can be created in the pad metal 408 corresponding to good pixels, whereas holes are not created for bad pixels. Thus, when the mask is coupled to the wafer, the good pixels are coupled to the indium bumps of the vias 410 through the holes 412 in the pad metal 408, thereby allowing signals to be communicated from the good pixels.

Figure 5:
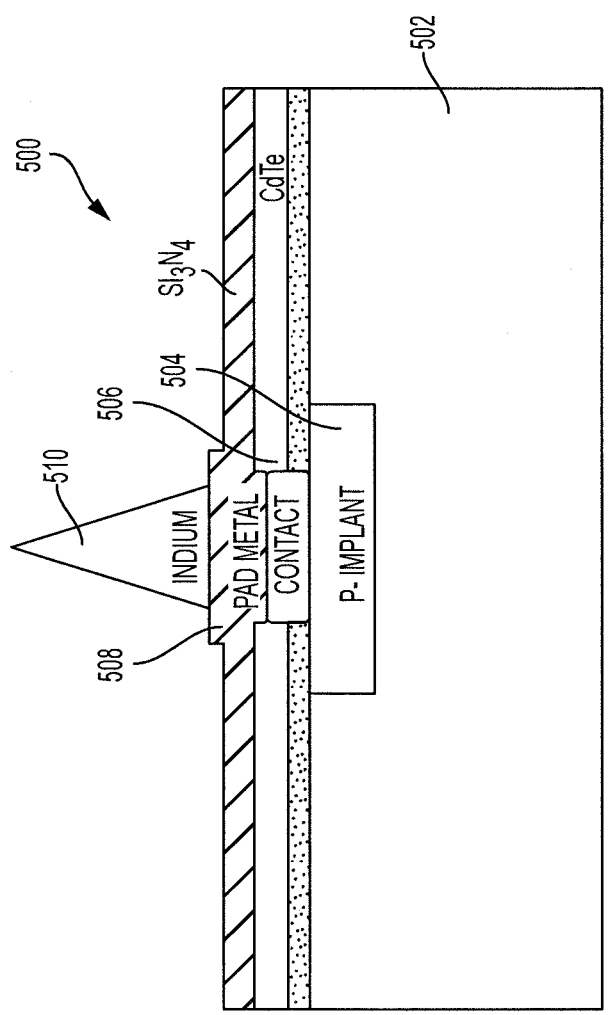
FIG. 5 is a diagram depicting a cross-sectional view of a hybridized ROIC of a bad pixel for isolating bad pixels according to an exemplary embodiment of the present invention.

FIG. 5 is a diagram depicting a cross-sectional view of a hybridized ROIC 500 of a bad pixel according to an exemplary embodiment of the present invention's method for isolating bad pixels. The hybridized ROIC 500 can comprise a pixel 502, an implant 504, a P contact 506, a pad metal 508, and a via 510. In related versions, the via 510 can be an indium bump as well-known in the art. As illustrated, the implant 504, the P contact 506, the pad metal 508 and the via 510 are arranged epitaxially as known in the art for SCAs. In related versions, the P contact 506 can comprise a CdTe epitaxial layer, and the pad metal 508 can comprise $Si_3N_4$.

In this case, the pixel 502 is a bad pixel, and so the via 510 is closed. According to the above description, because the pixel 502 is a bad pixel, the pad metal 508 does not have a hole, and acts as an insulating layer between the indium bump of the via 510 and the P contact 506. In certain versions, the pad metal 508 is a part of the mask as described above. The mask can comprise a sheet of pad metal 508 with vias corresponding to each pixel of a wafer. Holes can be created in the pad metal 508 corresponding to good pixels, whereas holes are not created for bad pixels. Thus, when the mask is coupled to the wafer, the bad pixels are prevented from being coupled to the indium bumps of the vias 510 by the pad metal 508, thereby preventing signals from being communicated from the bad pixels.

FIG. 6 is a flowchart depicting an exemplary embodiment of the present invention's method for isolating bad pixels. This present invention's method, such as method 600, provides the ability to map and isolate bad pixels prior to hybridizing a detector chip to an ROIC.

As shown in FIG. 6, method 600 comprises steps 602 to 610. At step 602, physical locations of bad pixels on the wafer are determined. In related versions, the wafer can comprise a plurality of pixels, each pixel corresponding to a closed via on the mask. In related versions, the wafer can comprise an SCA.

At step 604, physical locations of the bad pixels on the wafer are determined.

In related versions, alignment targets are established on the wafer, and physical locations of the bad pixels are determined relative to the alignment targets.

In related versions, each of the physical locations of the bad pixels is assigned an X-Y coordinate value and is plotted onto an X-Y coordinate plane.

At step 606, a mask is created based on the physical locations of the bad pixels. As described above, this can further comprise opening all of the closed vias except for those corresponding to the bad pixels. Each bad pixel corresponds to a closed via such that the bad pixels are prevented from communicating signals to the ROIC.

In related versions, the physical locations are translated onto a mask. The mask comprises a metal insulating layer. The mask can be digitally generated, or can be a physical mask, as described above.

In related versions, the mask is created based on the physical locations of the bad pixels as plotted onto the X-Y coordinate plane.

At step 608, the mask is imprinted onto the wafer.

At step 610, the wafer is hybridized onto the ROIC such that the mask prevents electrical coupling between the bad pixels and the ROIC.

FIG. 7 is a flowchart depicting an alternate exemplary embodiment of the present invention's method for isolating bad pixels. This present invention's method, such as method 700, provides the ability to map and isolate bad pixels prior to hybridizing a detector chip to an ROIC.

As shown in FIG. 7, method 700 comprises steps 702 to 706. At step 702, physical locations of good pixels on the wafer are determined. The wafer can comprise a plurality of pixels, each bad pixel corresponding to a closed via such that the bad pixels are prevented from communicating signals to the ROIC. The wafer can comprise an SCA.

In related versions, each of the physical locations of the good pixels is assigned an X-Y coordinate value, and the X-Y coordinate values are plotted onto an X-Y coordinate plane.

At step 704, a mask is created based on the physical locations of the good pixels as plotted onto the X-Y coordinate plane. The mask determines which of the plurality of closed vias is to be opened.

In related versions, a plurality of closed vias is opened on the wafer corresponding to the physical locations of the good pixels.

At step 706, the wafer is hybridized onto an ROIC comprising a plurality of indium bumps, each of the plurality of indium bumps corresponding to each of the plurality of pixels.

Exemplary embodiments of the invention have been disclosed in an illustrative style. Accordingly, the terminology employed throughout should be read in a non-limiting manner. Although minor modifications to the teachings herein will occur to those well versed in the art, it shall be understood that what is intended to be circumscribed within the scope of the patent warranted hereon are all such embodiments that reasonably fall within the scope of the advancement to the art hereby contributed, and that that scope shall not be restricted.

What is claimed is:

1. A method of isolating bad pixels on a wafer comprising the steps of:
    determining physical locations of the bad pixels on the wafer;
    creating a mask based on the physical locations of the bad pixels;
    imprinting the mask onto the wafer; and
    hybridizing the wafer onto a readout integrated circuit (ROIC).

2. The method of claim 1 wherein the wafer comprises a plurality of pixels, each pixel corresponding to a closed via on the mask.

3. The method of claim 2 wherein the step of creating the mask further comprises opening all of the closed vias except for those corresponding to the bad pixels.

4. The method of claim 3 wherein each bad pixel corresponds to a closed via such that the bad pixels are prevented from communicating signals to the ROIC.

5. The method of claim 1 further comprising, after the step of determining physical locations, the steps of:
    assigning each of the physical locations of the bad pixels to an X-Y coordinate value; and
    plotting the X-Y coordinate values onto an X-Y coordinate plane.

6. The method of claim 5 wherein the mask is created based on the physical locations of the bad pixels as plotted onto the X-Y coordinate plane.

7. The method of claim 1 wherein the wafer comprises a sensor chip assembly (SCA).

8. A method of isolating bad pixels on a wafer comprising the steps of:
    establishing alignment targets on the wafer;
    determining physical locations of the bad pixels relative to the alignment targets;
    translating the physical locations onto a mask; and
    imprinting the mask onto the wafer.

9. The method of claim 8 further comprising the step of hybridizing the wafer onto a readout integrated circuit (ROIC) such that the mask prevents electrical coupling between the bad pixels and the ROIC.

10. The method of claim 8 wherein each of the physical locations corresponds to an X-Y coordinate for translation onto the mask.

11. The method of claim 9 wherein the wafer comprises a plurality of pixels, each pixel corresponding to a closed via on the mask.

12. The method of claim 11 wherein the step of imprinting the mask further comprises opening all of the closed vias except for those corresponding to the bad pixels.

13. The method of claim 12 wherein each bad pixel corresponds to a closed via such that the bad pixels are prevented from communicating signals to the ROIC.

14. The method of claim 8 wherein the mask comprises a metal insulating layer.

15. A method of isolating bad pixels on a wafer comprising a plurality of pixels, comprising the steps of:
    determining physical locations of good pixels on the wafer;
    opening a plurality of closed vias on the wafer corresponding to the physical locations of the good pixels; and
    hybridizing the wafer onto a readout integrated circuit (ROIC) comprising a plurality of indium bumps, each of the plurality of indium bumps corresponding to each of the plurality of pixels.

16. The method of claim 15 wherein each bad pixel corresponds to a closed via such that the bad pixels are prevented from communicating signals to the ROIC.

17. The method of claim 15 further comprising, after the step of determining physical locations, the steps of:
    assigning each of the physical locations of the good pixels to an X-Y coordinate value; and
    plotting the X-Y coordinate values onto an X-Y coordinate plane.

18. The method of claim 17 further comprising creating a mask based on the physical locations of the good pixels as plotted onto the X-Y coordinate plane.

19. The method of claim 18 wherein the mask determines which of the plurality of closed vias is to be opened.

20. The method of claim 15 wherein the wafer comprises a sensor chip assembly (SCA).

* * * * *